(12) United States Patent
Roth et al.

(10) Patent No.: US 12,277,360 B2
(45) Date of Patent: Apr. 15, 2025

(54) METHOD AND MONITORING SYSTEM FOR PROVIDING SIGNAL LEVEL PERFORMANCE INFORMATION

(71) Applicant: Rohde & Schwarz GmbH & Co. KG, Munich (DE)

(72) Inventors: Alexander Roth, Munich (DE); Florian Ramian, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1029 days.

(21) Appl. No.: 17/237,919

(22) Filed: Apr. 22, 2021

(65) Prior Publication Data

US 2022/0342624 A1    Oct. 27, 2022

(51) Int. Cl.
*G06F 3/14* (2006.01)
*G05B 15/02* (2006.01)

(52) U.S. Cl.
CPC ............ *G06F 3/1407* (2013.01); *G05B 15/02* (2013.01); *G06F 3/1423* (2013.01)

(58) Field of Classification Search
CPC ............................ G06F 3/1407; G06F 3/1423
See application file for complete search history.

(56) References Cited

U.S. PATENT DOCUMENTS

| | | | |
|---|---|---|---|
| 6,225,972 B1 | 5/2001 | Taraki et al. | |
| 2003/0086585 A1* | 5/2003 | Rhoads | G07F 7/1016 |
| | | | 704/E19.009 |
| 2020/0408837 A1 | 12/2020 | Ruengeler et al. | |

FOREIGN PATENT DOCUMENTS

EP        2577447 A1 *  4/2013  ............ G06F 7/556

* cited by examiner

*Primary Examiner* — Michael D. Yaary
(74) *Attorney, Agent, or Firm* — CHRISTENSEN O'CONNOR JOHNSON KINDNESS PLLC

(57) ABSTRACT

A method of providing signal level performance information with respect to an electronic component is described. The electronic component includes a signal input. An input signal is received at the signal input or immediately upstream of the signal input. At least one power level parameter is determined, wherein the power level parameter is indicative of a power level of the input signal received. A performance indicator is provided, which includes information on a performance of the electronic component in dependence of the at least one power level parameter. A signal level performance information is determined with respect to the electronic component based on the at least one determined power level parameter and based on the performance indicator. Further, a monitoring system is described.

16 Claims, 2 Drawing Sheets

METHOD AND MONITORING SYSTEM FOR PROVIDING SIGNAL LEVEL PERFORMANCE INFORMATION

FIELD OF THE DISCLOSURE

Embodiments of the present disclosure relate generally to a method of providing signal level performance information with respect to an electronic component. Further, embodiments of the present disclosure relate to a monitoring system for providing signal level performance information with respect to an electronic component.

BACKGROUND

In the state of the art, auto-leveling algorithms are used to automatically adapt the level of a signal processed by an electronic component, e.g., a circuit. The auto-leveling algorithms are used to ensure best error vector magnitude (EVM) performance of the respective electronic component, as it is essential to apply a correct signal level with respect to the electronic component that processes the signal in order to use the maximum dynamic range.

Besides the auto-leveling algorithms, it is also known that a user manually adapts the respective settings of the electronic component, particularly at the input of the electronic component, such that a correct signal level is applied. However, this manual adaption requires a lot of experience, as it is a non-trivial task, especially for users with less experience. To assist those users, it is also known in the state of the art to provide an overload indicator that is configured to indicate an overload of the respective electronic component that processes the signal, thereby warning the user concerning an upcoming failure of the electronic component. Hence, the user becomes aware of the overload.

However, the user does not receive a feedback with respect to the current leveling as well as its relation to the overall performance capabilities of the electronic component.

Accordingly, there is a need for a quick and simple indicator that provides an intuitive feedback to the user.

SUMMARY

Embodiments of the present disclosure concern a method of providing signal level performance information with respect to an electronic component. The electronic component comprises a signal input. In an embodiment, the method comprises the following steps:

receiving an input signal at the signal input of the electronic component or immediately upstream of the signal input of the electronic component;

determining at least one power level parameter, wherein the power level parameter is indicative of a power level of the input signal received;

providing a performance indicator, the performance indicator comprising information on a performance of the electronic component in dependence of the at least one power level parameter; and determining a signal level performance information with respect to the electronic component based on the at least one determined power level parameter and based on the performance indicator.

Further, embodiments of the present disclosure concern a monitoring system for providing signal level performance information with respect to an electronic component. The electronic component comprises a signal input. In an embodiment, the monitoring system comprises a power level detector and a processing circuit. The power level detector is configured to receive an input signal at the signal input of the electronic component or immediately upstream of the signal input of the electronic component. The power level detector is configured to determine at least one power level parameter, wherein the power level parameter is indicative of a power level of the input signal. The processing circuit is configured to provide a performance indicator. The performance indicator comprises information on a performance of the electronic component in dependence of the at least one power level parameter. The processing circuit is configured to determine a signal level performance information with respect to the electronic component based on the at least one determined power level parameter and based on the performance indicator.

Accordingly, the main idea is to provide an easy understandable and intuitive feedback concerning the signal level performance of the electronic component such that a user or rather customer is enabled to identify the actual leveling of the electronic component, for example with respect to an ideal range of the electronic component. Hence, the user can retrieve information concerning the operational status of the electronic component relative to its overall operational range.

The overall operational range of the electronic component is provided by the performance indicator for the respective power level parameter, which describes the full scale behavior of the electronic component with respect to the power level parameter.

The full scale may inter alia comprise an underload range, an ideal range and an overload range as well as at least one intermediate range of the electronic component, for instance between the ideal range and the underload range. However, the full scale may also comprise ranges associated with a compression and a non-linear behavior of the electronic component besides the ideal range. Generally, the kind of ranges depends on the respective power level parameter and/or the type of the respective electronic component which in turn affects the respective power level parameter.

In any case, the user retrieves more information as well as deeper insights concerning the electronic component in an easy understandable manner compared to a simple overload warning that only indicates that the power level parameter exceeds a hard clipping threshold.

In other words, the performance indicator provides an indication of the overall performance capability of the electronic component, which is associated with the type of the respective power level parameter and/or the type of the electronic component which has an impact on the respective power level parameter. The ideal range of the electronic component can be retrieved from the performance indicator accordingly.

In addition to the performance indicator, the signal level performance information is determined which is based on the performance indicator. In some embodiments, the signal level performance information defines the actual characteristic of the electronic component, namely the actually determined power level parameter, with respect to the performance indicator, e.g., the full scale of the electronic component. Accordingly, the signal level performance information provides a performance information of the electronic component with respect to the full scale, e.g., the actual value within the full scale of the electronic component.

Thus, the user can easily identify in which of the several ranges provided by the performance indicator the respective power level parameter is located, for example whether the electronic component is actually operated in the ideal range.

In addition, information is provided that indicates how close the actual power level parameter is to a certain range of the full scale, for instance the overload range, the ideal range and/or the underload range. Accordingly, the relative performance of the electronic component, namely the actual performance in relation to the overall performance characteristics provided by the performance indicator, can be easily derived from the signal level performance information. Hence, it can be determined if the electronic component is operated within or close to a certain range, for instance the overload range, the underload range or rather the ideal range.

In general, a clear indication is provided that the user intuitively understands. Hence, the user is enabled to determine whether the actual leveling has good or bad characteristics by taking the signal level performance information into account, for example the relative orientation of the actually determined power level parameter with respect to the performance indicator, namely with respect to the overall characteristics of the electronic component with respect to the power level parameter. Again, the signal level performance information provides an intuitive feedback of the actual power level parameter, namely the actually determined power level parameter, with respect to the full scale of the electronic component for that power level parameter.

Thus, the user is informed about a bad setting such that the user is enabled to adapt the settings, thereby improving the performance of the electronic component and, therefore, a superordinate circuit.

The performance indicator may be (automatically) determined, for instance by the processing circuit. Moreover, an existing performance indicator may be adapted by the processing circuit based on parameters measured. Thus, an internal testing may take place in order to determine the performance indicator.

Alternatively, the performance indicator may be received from an external source, e.g., an external device or rather a specification sheet for the electronic component.

In some embodiments, the electronic component may relate to a level sensitive component ("LSC"), namely an electronic component that is sensitive with regard to the level of the signal processed. Such an electronic component may be an analog-to-digital converter (ADC), an amplifier, a mixer, etc.

In other words, the power level parameter of the input signal is captured relative to the full scale of the electronic component that processes the input signal. The actually determined power level parameter is put in relation to the performance indicator that defines the behavior or rather characteristic of the electronic component over its full scale. The quick and intuitive feedback is generated by the signal level performance information, as the actually determined power level parameter is outputted in relation to the performance indicator, e.g., on a scale that provides an easy understandable relative feedback concerning the actually determined power level parameter with respect to the full scale performance provided by the performance indicator.

According to an aspect, the at least one power level parameter comprises a root mean square of an amplitude of the input signal, an amplitude distribution of the input signal, and/or a peak value of an amplitude of the input signal. The root mean square (RMS), the amplitude distribution and/or the peak value may be measured directly or rather determined based on measured values. Hence, the full scale of the electronic component, namely the performance indicator, may be provided for the RMS, the amplitude distribution and/or the peak value. Consequently, the signal level performance information provides the actual value concerning the RMS, the amplitude distribution and/or the peak value with respect to the full scale of the electronic component, namely the performance indicator.

Another aspect provides that the signal level performance information comprises a graphic representation of a performance of the electronic component at the determined power level parameter. The graphic representation provides a feedback that is easy to understand. The graphic representation may comprise a graphic illustration of the performance indicator, namely the full scale of the electronic component, as well as a graphic illustration of the actual value associated therewith, namely the power level parameter actually determined, for instance the RMS, the amplitude distribution and/or the peak value. The graphic illustration of the actual value, namely the power level parameter determined, may be located within the graphic illustration of the performance indicator, thereby providing a relative orientation, which provides the intuitive feedback to the user concerning the actual performance of the electronic component with respect to the full scale of the electronic component concerning the power level parameter, e.g., the RMS, the amplitude distribution and/or the peak value.

The graphic representation may be displayed on a display. In an embodiment, the monitoring system may comprise at least one display, wherein the at least one display is configured to display the graphic representation. The user may obtain the respective information directly by the display that displays the graphical information provided, e.g., by the processing circuit that is used to control the display appropriately.

In some embodiments, the processing circuit is configured to generate a graphical user interface (GUI) that is displayed on the display, wherein the graphic representation with the information to be outputted is displayed within the graphical user interface, for example besides further information such as advices how to improve the performance, thereby moving the actually determined power level parameter towards the ideal range of the performance indicator.

In some embodiments, the graphic representation comprises a gradient diagram portion, wherein a performance of the electronic component is coded in dependence of the at least one power level parameter. For instance, the graphic representation comprises a diagram that has a gradient portion, namely the gradient diagram portion, which is used to indicate at least one area of the full scale, e.g., a transition range. Thus, the gradient diagram portion may be used to indicate a certain area of the electronic component in an intuitive manner, e.g., the transition range.

The power level parameter actually determined may be located in a certain area of the gradient diagram portion, thereby providing an indication of the performance of the electronic component, for example with respect to the full scale of the electronic component.

In some embodiments, the performance of the electronic component is coded by the graphic representation. The coding may relate to a color coding. Alternatively, a density coding may be provided such that the density of the graphic representation is altered for the different ranges. The color coding may relate to colors red and green for indicating the different ranges. For instance, the range associated with the color green concerns the ideal range, whereas the color red is associated with a non-ideal range, for instance an overload range or rather an underload range.

The gradient diagram portion, for example the color gradient diagram portion, may provide a stepwise transition, e.g., a fading. Usually, the gradient diagram portion relates to a transition range between the ideal range and a non-critical, but non-ideal range, for instance an underload range.

Moreover, the graphic representation may also comprise a non-gradient diagram portion. The non-gradient diagram portion may relate to a hard transition between two differently coded areas, for instance an area associated with an ideal range and an area associated with a non-ideal and critical range, e.g., an overload range. For instance, the non-gradient diagram portion comprises a hard transition area, also called hard clipping threshold, between two differently coded areas, e.g., a red colored area immediately adjacent to a green colored area, for example without any color fading.

According to a further example, the graphic representation comprises textual information on the at least one determined power level parameter. The respective power level parameter may be labelled by the textual information that is located close to the graphic representation of the actually determined power level parameter illustrated. The labeling, namely the textual information, provides a clear association to the graphic representation of the power level parameter. This is helpful in case of several power level parameters illustrated simultaneously, for instance power level parameters of different electronic components and/or different power level parameters of the same electronic component.

Another aspect provides that the at least one power level parameter is determined by a physical detector or by a virtual detector. The physical detector physically measures the power level parameter, e.g., the peak value of the amplitude of the input signal.

The virtual detector is associated with an electronic component without a physical detector, wherein the virtual detector is provided by a virtual detector circuit. Hence, the virtual detector circuit is configured to use a model of a signal processing chain from the physical detector to the location of the virtual detector. The model comprises at least one model parameter for the signal processing chain. The monitoring system may be configured to adapt the virtual detector circuit with respect to a measurement type for the input signal. The virtual detector circuit may be further configured to use the model and at least one measurement value provided by a physical detector. The virtual detector circuit may be configured to determine a virtually determined value based on the model and the at least one measurement value. The monitoring system is configured to use the virtually determined value to determine a setting for the electronic component.

In some embodiments, the model provides information how the input signal is internally handled by the electronic component, for instance the signal processing chain. In some embodiments, the model provides information how the input signal is handled from the signal processing component with physical detector to the location of the signal processing component without virtual detector such that the signal path from the physical detector to the location of the virtual detector is modelled or rather simulated.

Generally, the virtual detector (component) and its implementation is described in more detail in US 2020/0408837 A1, the content of which is hereby incorporated by reference in its entirety.

The virtual detector may detect an underload, for instance an underload caused by too much attenuation. Hence, too much attenuation is set such that the signal is buried in noise. This kind of underload can be identified when the (measured) signal has low power and an attenuation is set. Then, the virtual detector or rather the graphical user interface may output a hint to decrease the attenuation in order to solve the underload detected by the virtual detector.

Alternatively, the virtual detector may detect another kind of underload, namely an underload caused by no pre-amplification. Hence, no pre-amplification is set such that the signal is buried in noise. This kind of underload can be identified when the (measured) signal has low power and the pre-amplification is not activated. Then, the virtual detector or rather the graphical user interface may output a hint to use the pre-amplification in order to solve the underload detected by the virtual detector.

Furthermore, the virtual detector may detect an overload, for instance an overload caused by a too high pre-amplification. Hence, a pre-amplification is set that is too high. This kind of overload can be identified when the (measured) signal has high power and the pre-amplification is activated. Then, the virtual detector or rather the graphical user interface may output a hint to deactivate or rather adapt the pre-amplification in order to solve the overload detected by the virtual detector.

Moreover, the virtual detector may also detect a conflict of the attenuation set and the pre-amplification set. The attenuation may be set higher than the pre-amplification gain-noise figure. This may be detected by taking the respective settings of the attenuator and the pre-amplifier into account. Then, the virtual detector or rather the graphical user interface may output a hint to decrease or rather adapt the attenuation and/or to switch off the pre-amplification in order to solve the conflict detected by the virtual detector.

In addition, the virtual detector may also detect a mixing level that is too high (compression). Hence, non-linear distortions will arise. The power of the signal may be measured wherein the measured power and known device parameters are taken into account in order to estimate whether the optimum mixing level is exceeded. Then, the virtual detector or rather the graphical user interface may output a hint to increase the attenuation in order to solve the conflict detected by the virtual detector.

The respective detections and consequences mentioned above are known, e.g., from US 2020/0408837 A1, the content of which is hereby incorporated by reference.

The processing circuit may be configured to determine a signal type of the input signal. Depending on the signal type, a certain power level parameter may be determined. The signal type may be measured, for example in case of an unknown signal type, or rather inputted previously in a manual manner in case that the user expects a certain type for the input signal. Generally, the respective input signal may be associated with a corresponding electronic component in case of several electronic components monitored when determining the signal type, as the respective signal type may be associated with a corresponding electronic component.

Moreover, several input signals may be received, wherein each input signal is associated with a different electronic component, and wherein the signal level performance information is determined for each electronic component. Depending on the signal type determined, the respective input signal can be associated with a corresponding electronic component such that the signal level performance information can be unambiguously associated with each of the electronic components.

The monitoring system may comprise several power level detectors being associated with different electronic components. Each power level detector is configured to determine at least one power level parameter associated with the respective electronic component. The power level parameter is indicative of a power level of the input signal of the respective electronic component. The processing circuit is configured to determine the signal level performance information with respect to each of the electronic components based on the determined power level parameters. Therefore, several electronic components that may be provided within a common device or rather a common circuit can be monitored simultaneously by the several power level detectors of the monitoring system such that the respective information is gathered immediately.

For instance, the graphic representation may comprise a diagram indicating the full scale for a certain type of electronic component, e.g., an analog-to-digital converter. In addition, the graphic representation comprises the actually determined power level parameters as well as textual information for each of the electronic components individually. The respective power level parameters have been determined by the several power level detectors.

For instance, a diagram may be provided that indicates a probability amplitude distribution on the y-axis and amplitude on the x-axis.

In some embodiments, graphic representations of the signal level performance information associated with the different electronic components are displayed on different displays or on the same display simultaneously. Hence, a separation of the information is obtained which may be helpful for distinguishing between the different electronic components.

A further aspect provides that the graphic representations are displayed within a common diagram or within separate diagrams. As mentioned above, a graphic representation of the signal level performance information may be provided for each of the electronic components. However, several of the electronic components may be of the same type such that a common diagram may be provided wherein the performance indicator is illustrated commonly for those electronic components. The graphic representations associated with the actually determined power level parameters of the electronic components may be illustrated in the common performance indicator wherein textual information is used to indicate the several graphic representations associated with the actually determined power level parameters appropriately.

Another aspect provides that the monitoring system comprises one or several displays, wherein the one or several displays is/are configured to display graphic representations of the signal level performance information associated with the different electronic components. In case of several electronic components investigated simultaneously or rather several power level parameters determined simultaneously, the respective information associated therewith may be graphically displayed on the several displays such that an unambiguous separation of the information is obtained. Alternatively, the information is provided on the same display, wherein the representations are labelled appropriately by means of textual information such that the user is enabled to distinguish them appropriately.

The several displays may be component-specific ones such that each display is associated with a certain type of the electronic component(s) that are monitored. The respective allocation of the displays and the electronic components may be adaptable by a user interface, for example by the graphical user interface.

In some embodiments, the at least one power level parameter determined is indicated on a scale associated with the performance indictor such that a feedback concerning the performance of the at least one electronic component is provided that is quick to comprehend. For instance, a red/green color scale is provided that is associated with the performance indicator while illustrating different ranges of the overall performance of the electronic component. Hence, a hard limit, e.g., an overload range, may be indicated, for instance by a hard change of the color (pattern) or rather generally the coding applied. As mentioned above, the coding may be associated with a color coding, a density coding or any other intuitive (graphical) feedback. Moreover, a soft decrease of the performance of the electronic component, namely a soft decrease in the quality of the input signal when processed by the electronic component, may be illustrated by a gradient, for instance a soft color change. Generally, the gradient may relate to a transition range. The soft decrease may relate to a decrease in performance due to signal-to-noise ratio (SNR).

The electronic component may relate to a mixer, for example an input mixer of a test instrument like a signal or spectrum analyzer. In this case, a gradient may indicate a compression or rather non-linear behavior of the mixer.

The electronic component may also be part of a transmission device, for instance a generator. In some embodiments, the electronic component may be an amplifier such as an output amplifier. Thus, the gradient may be associated with compression of the amplifier.

For instance, the electronic component may be part of a network analyzer, an oscilloscope, a receiver, a signal analyzer, a spectrum analyzer, a test instrument in general or a transmission device, among others.

Generally, a clear indication of good and/or bad performance of the electronic component is provided by a graphic illustration, for example by a graphic user interface, which directly guides the user to relevant parameters that may help to improve the performance of the electronic component and any device having the electronic component, for instance a reference level on a signal analyzer.

Accordingly, the performance indicator may provide information concerning the performance of the electronic component over input level, e.g., over the full scale of the electronic component. The result from the power level detector, namely the actually determined power level parameter, is mapped on the performance indicator, thereby providing a relation of the actual performance with respect to the full scale performance of the electronic component. Hence, the user retrieves a feedback how much of the available performance is used, wasted and/or exceeded.

This feedback may be done in a graphical manner by illustrating the performance indicator, e.g., by a scale such as a color scale, and the result obtained from the power level detector, namely the power level parameter.

The respective feedback is the signal level performance information that is based on the at least one power level parameter and based on the performance indicator, as the signal level performance information provides information concerning the actual performance with respect to the overall performance capability of the electronic component.

Depending on the (color) scale provided by the graphic representation of the signal level performance information, different power level parameters may be visualized simultaneously.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
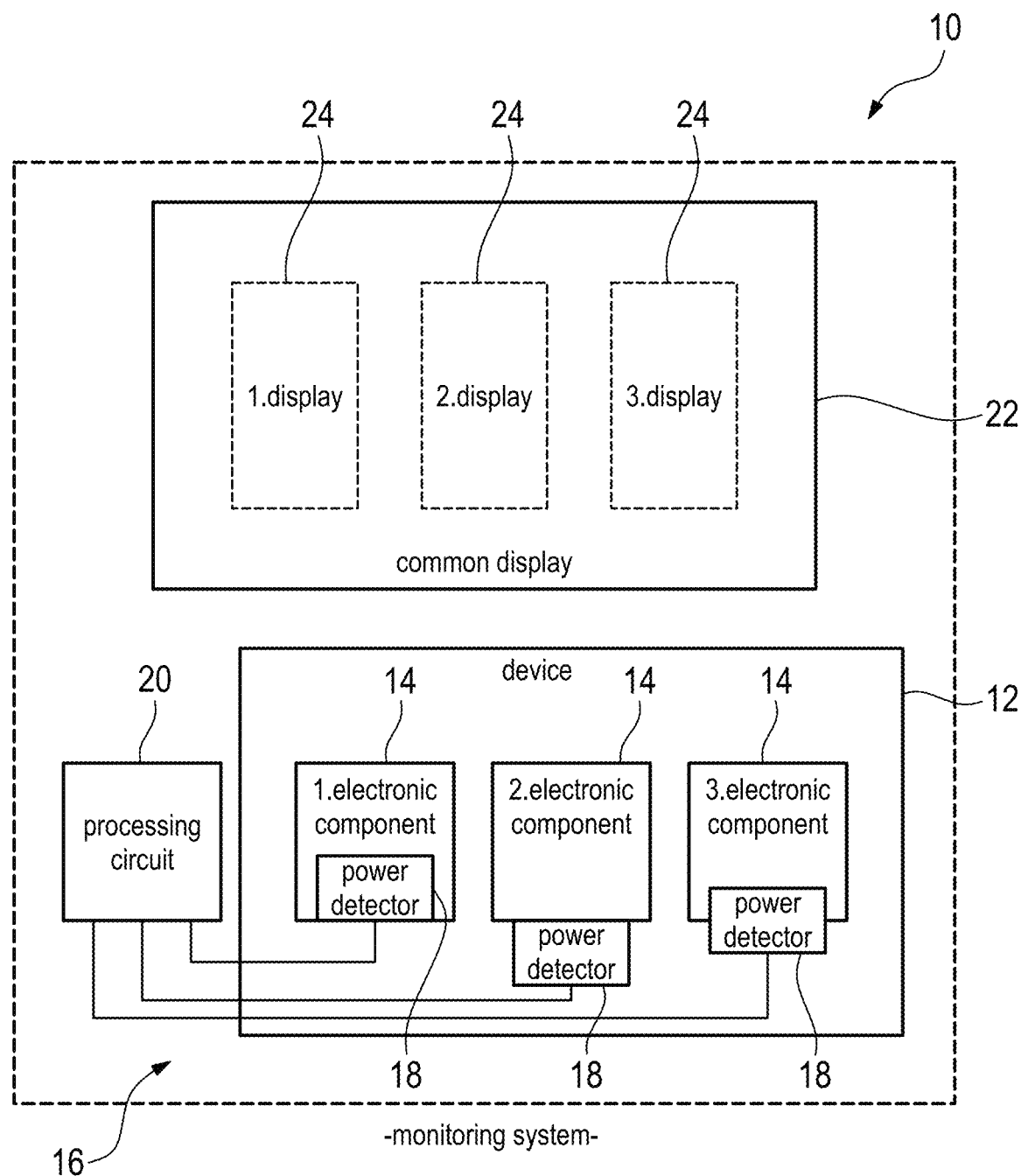
FIG. 1 schematically illustrates a representative monitoring system that provides signal level performance information with respect to an electronic component according to an embodiment of the present disclosure.

FIG. 1 shows a system 10 that comprises a device 12 with several electronic components 14 labelled with "1.electronic component", "2.electronic component", and "3.electronic component". The system 10 further comprises a monitoring system 16 that is used to provide signal level performance information with respect to at least one of the electronic components 14.

In the shown embodiment, the monitoring system 16 comprises several power level detectors 18 that are associated with signal inputs of the electronic components 14 such that the power level detectors 18 receive an input signal at the signal input of the respective electronic component 14 or immediately upstream of the signal input of the electronic component 14. In any case, the power level detectors 18 determine at least one power level parameter that is indicative of a power level of the input signal received by the corresponding electronic component 14. In some embodiments, the power level detectors 18 comprise circuitry, sensors, etc., to carry out the functionality of the associated therewith.

The power level detectors 18 are connected with a processing circuit 20 of the monitoring system 16 in a signal-transmitting manner such that information gathered by the power level detectors 18 is processed by the processing circuit 20 as will be described later in more detail.

In some embodiments, the power level detectors 18 may relate to physical detectors that physically measure the respective parameter. Alternatively, a virtual detector may be provided that is associated with an electronic component without physical detector, wherein the virtual detector is provided by a virtual detector circuit. Hence, the virtual detector circuit is configured to use a model of a signal processing chain from a physical detector to the location of the virtual detector.

The monitoring system 16 also comprises a common display 22 that is also connected with the processing circuit 20 such that processed information can be displayed via the common display 22. Alternatively, several individual displays 24 are provided that are illustrated by the dashed lines in FIG. 1, which are labelled by "1.display", "2.display", and "3.display". The several displays 24 may be associated with the respective electronic components 14 such that information obtained by a respective electronic component 14 is visualized on the associated display 24.

As further indicated by the dashed lines in FIG. 1, the monitoring system 16 may be integrated within the device 12. Hence, the entire system 10 may be provided by a single device having a housing that encompasses the components described above.

Generally, the power level detectors 18 are used to determine the actual power of the input signal processed by the respective electronic component 14, thereby obtaining information concerning the input signal to be processed by the electronic component 14 such that an actual performance of the electronic component 14 can be predicted. The actual performance of the electronic component 14 can be derived directly from the power level of the input signal and the known characteristics of the electronic component 14.

The known characteristics correspond to a performance indicator that is provided for the respective electronic component 14. In some embodiments, the performance indicator comprises information on a performance of the electronic component 14 in dependence of the at least one power level parameter determined, e.g., a root means square (RMS) of an amplitude of the input signal, an amplitude distribution of the input signal and/or a peak value of an amplitude of the input signal.

Generally, the performance indicator provides an indication of the full scale performance of the electronic component 14.

The processing circuit 20 processes the power level parameter determined together with the performance indicator measured or known from an external source such that a signal level performance information is determined, which provides a feedback concerning the actual performance of the electronic component 14 in relation to its overall capabilities. Hence, the signal level performance information is based on the at least one determined power level parameter and based on the performance indicator.

In the shown embodiment, the signal level performance information is outputted in a graphical manner by the common display 22 or the separate displays 24. For instance, the separate displays 24 may be allocated to the different electronic components 14 such that the signal level performance information of each electronic component 14 is displayed on a separate display 24. Hence, the displays 24 may relate to component-specific displays. Alternatively, the processing circuit 20 determines several different power level parameters that are illustrated on the different displays 24 accordingly.

In any case, the signal level performance information determined by the processing circuit 20 may comprise a graphic representation of the performance of the at least one electronic component 14 at the determined power level parameter.

Figure 2:
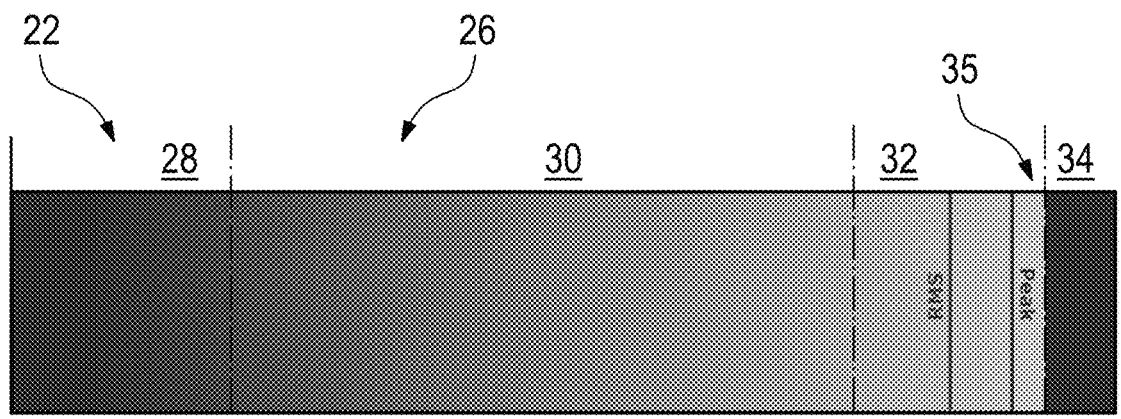
FIG. 2 schematically illustrates a diagram with graphic representations, which is generated by the monitoring system according to an embodiment of the present disclosure or by a method according to an embodiment of the present disclosure.

In FIG. 2, an exemplary diagram 26 is shown that comprises a graphic representation of the performance indicator illustrated by the respective scale, e.g., a color scale. The scale has several areas 28-34 that represent the respective ranges of the electronic component 14. In some embodiments, the ranges together, which are visualized by the areas 28-34, correspond to the full range or rather full scale of the electronic component 14.

As shown in FIG. 2, the graphic representation comprises an area or portion 32 associated with an ideal range which is coded differently compared to the other areas or rather portions 28, 30, 34. Moreover, non-ideal ranges are visualized by other areas or rather portions 28, 34 that are coded accordingly.

In addition, a transition area from the ideal range to a non-ideal, but non-critical range is also visualized by a gradient diagram portion 30. In some embodiments, this transition area relates to the left side of the area or portion 32 associated with the ideal range.

In contrast thereto, the right side of the area or portion 32 associated with the ideal range has a non-gradient diagram portion. In some embodiments, a hard transition 35, also called hard clipping threshold, is provided between the area or portion 32 associated with the ideal range and the area 34 on the right of the area or portion 32, which is associated with the non-ideal range, for example the non-ideal and critical range.

For example, areas 28, 30, 32, and 34 can be color-coded, namely by "green" and "red" as well as gradient transitions between these colors as indicated, for example, by area 30 (area 30 transitions from red to green. In the embodiment shown in FIG. 2, the left most side of area 28 is red. In an embodiment, area 28 begins to transition in color near the right most side of area 28. The diagram 26 in FIG. 2 continues to transition from red to green in area 30. In some embodiments, the area 32 to the hard transition 35 is green. After the hard transition 35, area 34 is red.

In some embodiments, the performance of the electronic component 14 is coded in dependence of the at least one power level parameter, for instance the RMS or the peak value. The actually determined power level parameter is also visualized by a graphic representation on the scale provided, wherein the same scale can be used for two different power level parameters of the electronic component 14 simultaneously. The graphic representation comprises textual information on the power level parameters such that they can be distinguished from each other.

Therefore, the user directly gathers the information that the peak value is located in the ideal range, whereas available performance is wasted with regard to the RMS that is closer to the transition area illustrated by portion 30 of the diagram 26.

As mentioned before, the processing circuit 20 that generates a graphical user interface that is visualized on the common display 22 or rather the several displays 24 is generally enabled to process power level parameters determined for several electronic components 14 simultaneously. Hence, the signal level performance information is determined for each electronic component 14 individually.

The processing circuit 20 generates graphic representations of the signal level performance information associated with the different electronic components 14, wherein these graphic representations are visualized on the separate displays 24, namely the component-specific displays, or on the common display 22, for instance in different areas of the common display 22.

The diagram shown in FIG. 2 may also provide the signal level performance information associated with two different electronic components 14, wherein the RMS is illustrated for a first electronic component 14 and the peak value is illustrated for a second electronic component 14. Hence, the graphic representations are associated with different power level parameters and different electronic components 14, but displayed within a common diagram, e.g., a common scale. The common diagram or common scale may illustrate two different performance indicators, namely one associated with the RMS and one associated with the peak value, in a common manner such that both power level parameters can be commonly visualized by the common diagram.

Thus, the user obtains a lot of information in a compact and intuitive manner, as the user becomes aware of the actual performance of two different electronic components 14 with respect to two different power level parameters in relation to the full scale of the respective electronic components 14. In some embodiments, the RMS and peak value may also be associated with the same electronic component 14.

Accordingly, a feedback is provided in a graphical manner by illustrating the performance indicator(s), e.g., by a scale such as a color scale, and the result obtained from the power level detector(s) 18, namely the power level parameter actually determined. The respective feedback is the signal level performance information that is based on the at least one power level parameter and based on the at least one performance indicator. Depending on the (color) scale provided by the graphic representation of the signal level performance information, different power level parameters may be visualized simultaneously as shown in FIG. 2.

Figure 3:
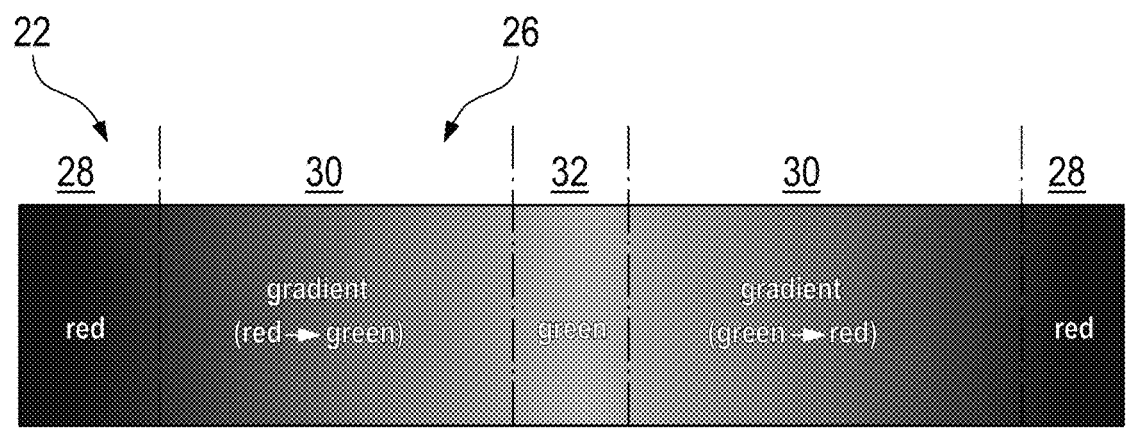
FIG. 3 schematically illustrates a diagram with graphic representations, which is generated by the monitoring system according to an embodiment of the present disclosure or by a method according to an embodiment of the present disclosure.

In FIG. 3, another example of a diagram with graphic representations is shown, namely for an electronic component 14 established by a mixer. In comparison to FIG. 2, the diagram shown in FIG. 3 comprises two gradient areas 30 on both sides of the area or rather portion 32 associated with the ideal range.

Accordingly, the electronic component 14 established by the mixer has two non-ideal, but non-critical ranges next to the boundaries of the ideal range rather than a non-ideal and critical range on one side of the ideal range, resulting in a hard transition. Therefore, the diagram has an area 26 associated with the ideal range, two non-ideal, but non-critical ranges associated with the gradient diagram portions 30 as well as two non-ideal and critical areas 28. The respective areas 26, 28, 30 are coded differently, for instance by different colors.

Hence, no hard transition area, also called hard clipping threshold, is provided in the diagram shown in FIG. 3 in contrast to the diagram shown in FIG. 2, which has a hard transition area at the right of the area 32 associated with the ideal range.

In FIG. 3, the respective areas 28, 30 and 32 are color-coded, namely by "green" and "red" as well as gradient transitions between these colors as indicated in FIG. 3. In other words, area 28 transitions from red at the left and right most sides of FIG. 3 to a red/green gradient in area 30, and then to area 32, which is green.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of providing signal level performance information with respect to an electronic component, the electronic component comprising a signal input, the method comprising:
  receiving an input signal at the signal input of the electronic component or immediately upstream of the signal input of the electronic component;
  determining at least one power level parameter, wherein the power level parameter is indicative of a power level of the input signal received;
  providing a performance indicator, the performance indicator comprising information on a performance of the electronic component in dependence of the at least one power level parameter; and
  determining a signal level performance information with respect to the electronic component based on the at least one determined power level parameter and based on the performance indicator,
  wherein the signal level performance information comprises a graphic representation of a performance of the electronic component at the determined power level parameter, and
  wherein the graphic representation comprises a gradient diagram portion, wherein the gradient diagram portion codes a performance of the electronic component in dependence of the at least one power level parameter determined, wherein the gradient diagram portion codes the performance of the electronic component relative to an ideal performance range of the electronic component or relative to a critical performance range of the electronic component.

2. The method of claim 1, wherein the at least one power level parameter comprises at least one of a root mean square of an amplitude of the input signal, an amplitude distribution of the input signal, and a peak value of an amplitude of the input signal.

3. The method of claim 1, wherein the graphic representation is displayed on a display.

4. The method of claim 1, wherein the graphic representation comprises textual information on the at least one determined power level parameter.

5. The method of claim 1, wherein the at least one power level parameter is determined by a physical detector or by a virtual detector.

6. The method of claim 1, wherein several input signals are received, wherein each input signal is associated with a different electronic component, and wherein the signal level performance information is determined for each electronic component.

7. The method of claim 6, wherein graphic representations of the signal level performance information associated with the different electronic components are displayed on different displays or on the same display simultaneously.

8. The method of claim 7, wherein the graphic representations are displayed within a common diagram or within separate diagrams.

9. A monitoring system for providing signal level performance information with respect to an electronic component, the electronic component comprising a signal input, the monitoring system comprising:
  a power level detector configured to receive an input signal at the signal input of the electronic component or immediately upstream of the signal input of the electronic component, and configured to determine at least one power level parameter, wherein the power level parameter is indicative of a power level of the input signal; and
  a processing circuit configured to provide a performance indicator, the performance indicator comprising information on a performance of the electronic component in dependence of the at least one power level parameter, the processing circuit further being configured to determine a signal level performance information with respect to the electronic component based on the at least one determined power level parameter and based on the performance indicator,
  wherein the signal level performance information comprises a graphic representation of a performance of the electronic component at the determined power level parameter, and
  wherein the graphic representation comprises a gradient diagram portion, wherein the gradient diagram portion codes a performance of the electronic component in dependence of the at least one power level parameter determined, wherein the gradient diagram portion codes the performance of the electronic component relative to an ideal performance range of the electronic component or relative to a critical performance range of the electronic component.

10. The monitoring system of claim 9, wherein the at least one power level parameter comprises at least one of a root mean square of an amplitude of the input signal, an amplitude distribution of the input signal, or a peak value of an amplitude of the input signal.

11. The monitoring system of claim 9, wherein the monitoring system comprises at least one display, wherein the at least one display is configured to display the graphic representation.

12. The monitoring system of claim 9, wherein the graphic representation comprises textual information on the at least one determined power level parameter.

13. The monitoring system of claim 9, wherein the power level detector is established as at least one of a physical detector or a virtual detector.

14. The monitoring system of claim 9, wherein the processing circuit is configured to determine a signal type of the input signal.

15. The monitoring system of claim 9, wherein the monitoring system comprises several power level detectors being associated with different electronic components,
    each power level detector being configured to determine at least one power level parameter associated with the respective electronic component, wherein the power level parameter is indicative of a power level of the input signal of the respective electronic component, and
    the processing circuit being configured to determine the signal level performance information with respect to each of the electronic components based on the determined power level parameters.

16. The monitoring system of claim 15, wherein the monitoring system comprises one or several displays, and wherein the one or several displays are configured to display graphic representations of the signal level performance information associated with the different electronic components.

* * * * *